US 8,829,770 B2

(12) United States Patent
Ramsza et al.

(10) Patent No.: US 8,829,770 B2
(45) Date of Patent: Sep. 9, 2014

(54) ELECTRODE COOLING SYSTEM IN A MULTI-ELECTRODE MICROWAVE PLASMA EXCITATION SOURCE

(71) Applicant: Instytut Optyki Stosowanej, Warsaw (PL)

(72) Inventors: Andrzej Ramsza, Warsaw (PL); Krzysztof Jankowski, Warsaw (PL); Edward Reszke, Wroclaw (PL)

(73) Assignee: Instytut Optyki Stosowanej, Warsaw (PL)

( * ) Notice: Subject to any disclaimer, the term of this patent is extended or adjusted under 35 U.S.C. 154(b) by 0 days.

(21) Appl. No.: 14/057,706

(22) Filed: Oct. 18, 2013

(65) Prior Publication Data
US 2014/0042888 A1    Feb. 13, 2014

Related U.S. Application Data

(63) Continuation of application No. PCT/PL2012/000051, filed on Jul. 7, 2012.

(30) Foreign Application Priority Data

Oct. 13, 2011  (PL) .......................... 396627

(51) Int. Cl.
*H01J 7/24*     (2006.01)
*H01J 17/28*    (2006.01)
*H01J 27/16*    (2006.01)
*H05H 1/46*     (2006.01)
*H01J 37/32*    (2006.01)

(52) U.S. Cl.
CPC .. *H01J 7/24* (2013.01); *H05H 1/46* (2013.01); *H01J 37/3222* (2013.01); *H01J 37/32192* (2013.01); *H01J 37/32568* (2013.01)
USPC .............. 313/30; 313/32; 313/35; 118/723 R

(58) Field of Classification Search
USPC ................... 313/11–47; 118/723 R–723 IR
See application file for complete search history.

(56) References Cited

U.S. PATENT DOCUMENTS 4,745,337 A    5/1988  Pichot et al.
(Continued)

FOREIGN PATENT DOCUMENTS

| DE | 4136297 A | 5/1993 |
|---|---|---|
| EP | 2009029 A1 * | 12/2008 |
| PL | 385484 A1 | 12/2009 |

OTHER PUBLICATIONS

Krzystof Jankowski, et al., Implementation of Acoustic, Radiofrequency and Microwave rotating fields in Analytical Plasma Sources. Spectrochimica Acta Part B, Mar. 10, 2011, pp. 500-507, vol. 66 No. 7, New York, NY.
International Search Report for Corresponding PCT Application No. PCT/PL2012/000051, mailed Nov. 26, 2012.

(Continued)

*Primary Examiner* — Mariceli Santiago
(74) *Attorney, Agent, or Firm* — Myers Wolin, LLC

(57) ABSTRACT

The excitation source consists of at least three identical electrodes arranged symmetrically in relation to the axis of the central tube, which supplies an analytical sample, and electrode cooling agent supply and removal systems. The electrodes are mounted in an electrically isolated metal housing so that the electrode tops are placed at the central tube outlet, and their ends are shorted in the power supply point with the microwave connections embedded in the housing on the extension of the electrode longitudinal axis and the connections are coupled with the microwave power source, the length of each electrode is ¼ L, where L is the length of the microwave. Each electrode has a hollowed longitudinal flow chamber for the cooling agent connected with metal side tubes, which supply and remove the cooling agent, while outside tube ends are electrically shorted with the housing.

3 Claims, 2 Drawing Sheets

(56) References Cited

U.S. PATENT DOCUMENTS

| | | | |
|---|---|---|---|
| 4,957,062 A | * | 9/1990 | Schuurmans et al. . 118/723 DC |
| 5,232,569 A | | 8/1993 | Nelson et al. |
| 5,234,565 A | * | 8/1993 | Yoshida ................ 118/723 MA |
| 5,568,015 A | | 10/1996 | Holber et al. |

OTHER PUBLICATIONS

Written Opinion of the International Searching Authority for corresponding application PCT/PL2012/000051, mailed Apr. 24, 2014.

International Preliminary Report on Patentability for corresponding application PCT/PL2012/000051, mailed Apr. 24, 2014.

* cited by examiner

ELECTRODE COOLING SYSTEM IN A MULTI-ELECTRODE MICROWAVE PLASMA EXCITATION SOURCE

CROSS REFERENCE TO RELATED APPLICATIONS

The present application is a continuation of International Application No. PCT/PL2012/000051, filed on Jul. 7, 2012, which claims priority to Polish Patent Application PL396627, filed on Oct. 13, 2011, the contents of each of which are incorporated herein by reference.

FIELD OF THE INVENTION

The subject of the invention is an electrode cooling system in a multi-electrode microwave plasma excitation source the purpose of which is to intensify cooling of capacitive microwave plasma excitation sources applied in various analytical techniques, particularly in optical emission spectrometry and mass spectrometry

BACKGROUND

Background Microwave plasma excitation sources are applied in various analytical techniques to excite an analytical sample being fed to a plasma zone. Due to a high plasma temperature, electrodes applied in capacitive excitation sources, which are also called antennas, may reach high surface temperature values related to thermal conduction and plasma radiation. When a certain critical density of power supplied to one electrode has been exceeded, depending on the above-mentioned factors, analytical lines related to the electrode material show up in the emission spectrum and, if the power density still increases, the electrode may even get damaged. The described processes restrain such significant parameters of a spectral source as electron density number and excitation temperatures. Intensive electrode cooling is necessary for a potential application of sufficiently high source parameters.

In typical microwave excitation sources in which the microwave resonator is unified with a 2.45 GHz microwave energy generator, the resonator is cooled with systems using a cooling gas or liquid which does not absorb a microwave radiation. A water aerosol may be also used as such a medium because radiation absorption by water particles sprayed in a gas is weak. If water is used, a cooling system must be located outside the microwave field force line concentration zone, e.g. in the microwave resonator walls or on the discharge tube circumference to avoid excessive microwave radiation absorption by water.

U.S. Pat. No. 5,568,015 patent specification describes a microwave plasma excitation source in which the microwave plasma generator resonator is made of a dielectric material and the cooling agent is essentially supplied via a spiral channel remaining in contact with the resonator wall and an external medium which does not absorb microwaves. In such a system, water can be used as a cooling agent due to the appropriate situation of a spiral channel in relation to the microwave field force lines. This solution is intended for a single-electrode plasma excitation source.

A method and system for plasma heating in a multi-phase electrode system is known from PL 385484 patent application. The method is that at least three electromagnetic waves are supplied by at least three identical elements of a plasma generator to the points which are symmetrically distributed on a circle around the generated plasma. As a result of a gas flowing through the circle center, plasma gets a toroidal shape through the center of which outside particles are fed. The system is equipped with at least one power generator and at least three identical electrodes distributed symmetrically on a circle in the center of which the plasma generator discharge tube is placed perpendicularly to the electrode system. The discharge tube incorporates a tube which feeds the outside particles to the plasma excitation area. The length of the electrodes used in such excitation sources is usually ¼ L or equal to an odd multiple of this length, where L is the length of a microwave generated by a microwave energy source and the electrode length is measured from its top to the power supply point. If the power supply point is connected to the electrode at a microwave maximum, the electrode length can be also ¾ L or its multiple.

SUMMARY

Multi-electrode excitation sources with a capacitive coupling are used to generate a rotating microwave field and obtain stable toroidal plasma in the excitation area from both inert gases, such as argon, helium, neon, and such molecular gases as hydrogen, nitrogen, oxygen or atmospheric air. After the microwave plasma has been generated, the electrode temperature rises depending on the operating gas flow through the excitation source and the electrode material and structure as well as the electrode supply mode, i.e. a pulse or continuous one. The electrodes are cooled by air supplied to the electrodes via the channels in the electrode shield housing. Despite the air cooling, during a prolonged operation of the excitation source, the electrode surfaces may reach high temperatures related to thermal conduction and plasma radiation.

The purpose of the invention is to develop a cooling system intended for intensive cooling of a multi-electrode microwave plasma excitation source where the energy from a high frequency generator is supplied to the plasma stream via a capacitive coupling.

The electrode cooling system in a multi-electrode microwave plasma excitation source, comprising electrode cooling agent supply and removal systems, while the excitation source consists of at least three identical electrodes arranged symmetrically in relation to the axis of the central tube which supplies an analytical sample and the electrodes are mounted in an electrically isolated metal housing so that the electrode tops are placed at the central tube outlet, and their ends are shorted in the power supply point with the microwave connections embedded in the housing on the extension of the electrode longitudinal axis and the connections are coupled with the microwave power source, particularly of 2.45 GHz frequency, whereas the length of each electrode measured from its top to the power supply point is ¼ L, where L is the length of the microwave generated by the microwave power source, according to the invention, is distinguished by a feature that each electrode has a hollow longitudinal flow chamber for the cooling agent connected with metal side tubes, the first and the second ones, which supply and remove the cooling agent, while the outside tube ends are electrically shorted with the housing and the length of each side tube inside the metal housing, measured from the connection with the electrode to the outside housing wall 10, is ¼ L. In addition, the side tubes are isolated from the housing over the whole length and the tubes are favorably connected with the inlet and outlet tube connectors outside the housing.

Another electrode cooling system in a multi-electrode microwave plasma excitation source, comprising electrode cooling agent supply and removal systems, while the excitation source consists of at least three identical electrodes arranged symmetrically in relation to the axis of the central tube which supplies an analytical sample and the electrodes are mounted in an electrically isolated metal housing so that the electrode tops are placed at the central tube outlet, and their ends are extended to the outside wall on the housing circumference and moreover the electrodes are shorted on the circumference in the power supply point with the microwave connections embedded in the housing and the connections are coupled with the microwave power source, particularly of 2.45 GHz frequency, whereas the length of each electrode measured from its top to its end at the outside wall on the housing circumference is ¾ L, where L is the length of the microwave generated by the microwave power source, according to the invention, is distinguished by a feature that each electrode has a hollowed longitudinal flow chamber for the cooling agent with the embedded internal tube connected with the inlet tube connector placed outside the electrode and the outlet tube connector is connected to the internal channel in the flow chamber arranged around the internal tube and the tube connectors are located outside the metal housing, whereas the end of each electrode is shortened with the housing, the distance from the power supply point to the top is ½ L and the distance from this point to the microwave connection embedded in the housing is ¼ L.

According to the invention, the cooling system practically does not absorb microwave radiation so that various cooling liquids, including water, can be used as a cooling agent for intensive electrode cooling in a multi-electrode plasma excitation source without any microwave power losses.

In a multi-electrode excitation source with a microwave connection installed in the electrode longitudinal axis, no cooling water can be supplied into the electrode via a dielectric tube since a dielectric, as a loss material, will absorb some power on its own and will start to heat up. It will result in some losses of power supplied to plasma. To avoid the above effect, the length of the metal side tubes should be ¼ of the microwave length L or its multiple. If quarter-wavelength electrodes and side tubes are used, so called quarter-wave support known from the microwave technology occurs, which is infinite parallel impedance for microwaves.

In the case of a multi-electrode excitation source with a microwave connection installed perpendicularly or at an angle to the electrode, cooling water can be supplied via the tube connectors located outside the housing. The internal tube may be made of any material because a microwave propagates over the electrode surface. If an electrode of the length ¾ L is used, its end should be situated at the housing outside wall and the power supply point should be shorted with the electrode at a quarter-wave distance from the electrode end and from the microwave connection. In such a cooling system, quarter-wave support occurs during the electrode operation, which allows the electrodes to be water-cooled without any microwave power losses.

BRIEF DESCRIPTION OF THE DRAWINGS

The subject of the invention is explained in the example shown in the drawings, where.

DETAILED DESCRIPTION OF THE PREFERRED EMBODIMENTS

Figure 1:
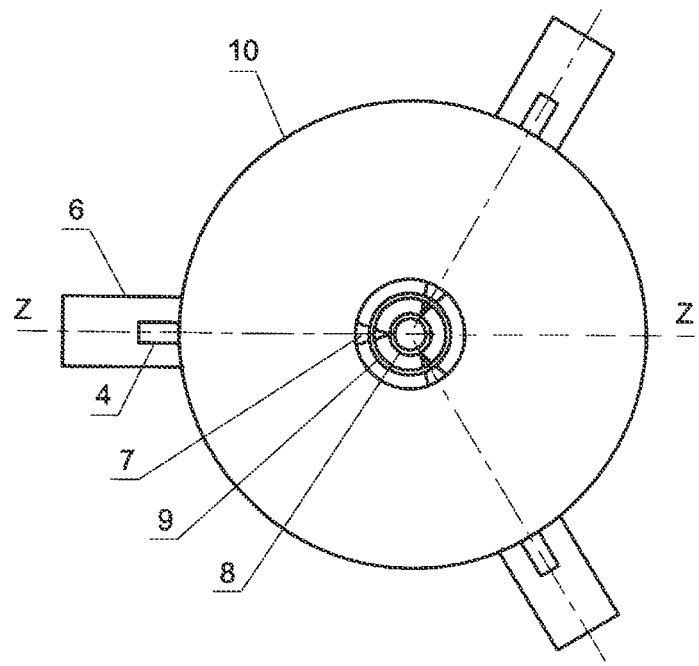
FIG. 1 presents a multi-electrode microwave plasma excitation source in top view.
Figure 2:
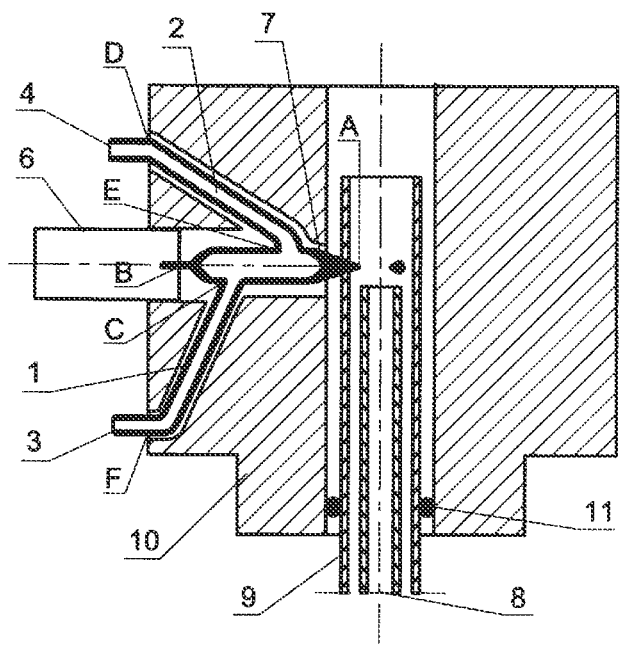
FIG. 2 presents the excitation source from FIG. 1 in the Z-Z axial section.

As shown in FIG. 1 and FIG. 2, the multi-electrode microwave plasma excitation source consists of at least three identical electrodes 7 arranged symmetrically in relation to the axis of the central tube 9 which supplies the analytical sample in the gaseous state as a mixture of gases or an aerosol with the operating gas. The electrodes 7 are installed in the electrically isolated metal housing 1 so that the tops A of the electrodes 7 are placed at the outlet of the central tube 9 and their ends are shorted in the power supply point B with the microwave connections 6 embedded in the housing 10 on the extension of the longitudinal axis of the electrodes 7. The microwave connections are linked with the microwave power source. The phase shift between the electrodes enables the system to obtain a rotational microwave field and generate stable toroidal plasma in the plasma excitation zone between the tops of the electrodes 7. The central tube 9 is installed inside the discharge tube 8 situated concentrically inside the housing 10 by means of the ring gasket 11. Air, operating gas or curtain gas can be supplied through the discharge tube 8. If there is no discharge tube 8, its function may be performed by the cylindrical channel formed by the internal walls of the housing 10. The central tube 9 and the discharge tube 8 are made of a dielectric material, usually of ceramics or quartz. The purpose of the metal housing 10 is to fix and shield the electrodes 7. The cooling system of the electrodes 7 comprises the flow chamber hollowed inside each of the electrodes 7 and the cooling agent supply and removal tubes.

As shown in FIG. 2, the cooling system of each of the electrodes 7 consists of the metal side tubes 1, 2, the first and the second ones, which supply and remove the cooling agent to the flow chamber hollowed in the electrode 7. The side tubes 1, 2 are asymmetrically connected to the electrode 7 on the opposite sides of its circumference, at a different distance from its top A and the outside ends D, F of the tubes situated at the outside wall on the circumference of the cylindrical housing 10 are electrically shorted with the housing 10. The length of each of the electrodes 7, measured from its top A to the power supply point B, equals to ¼ L, where L is the length of the microwave generated by the microwave power source. The length of each of the side tubes 1, 2 inside the metal housing 10, measured from the connection with the electrode 7 to the outside wall of the housing 10 is equal to the length of the electrode 7 and the side tubes 1, 2 over the entire length are isolated from the housing 10. The tube ends can be equipped with spacing elements.

The side tubes 1, 2 are connected outside the housing 10 with the inlet and outlet tube connectors 3, 4. Both tubes are installed on the opposite sides of the longitudinal axis of the electrode 7 and obliquely bent towards the outside wall on the circumference of the cylindrical housing 10. The length of the first side tube 1 is determined by the distance between its outside end D and the inside end E permanently fixed to the electrode 7. The length of the second side tube 2 is determined by the distance between its outside end F and the inside end C permanently fixed to the electrode 7. If the discharge tube 8 is extended beyond the plasma excitation zone, holes for the electrodes 7 are made in its side walls.

Figure 3:
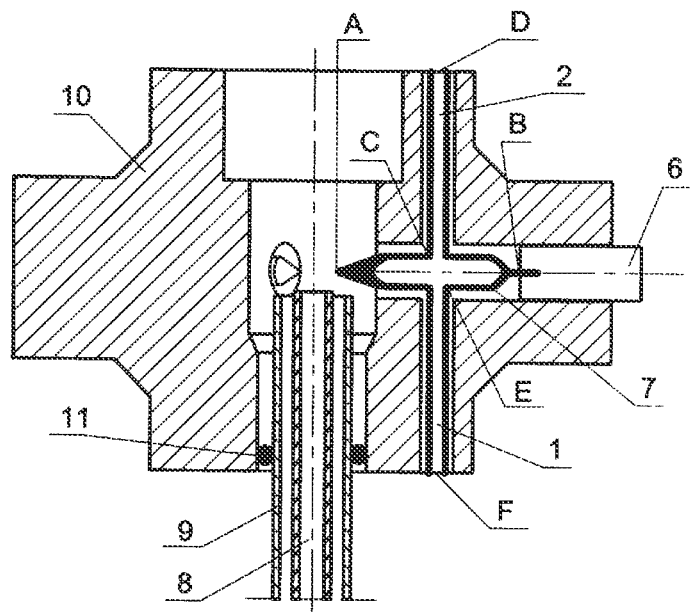
FIG. 3 shows another embodiment of the cooling system in a multi-electrode excitation source and FIG. 4 shows another multi-electrode microwave plasma excitation source with an electrode cooling system.

The cooling system presented in FIG. 3 is different because the side tubes 1, 2 are symmetrically connected to the electrode 7 at the same distance from the top A. Both tubes are situated perpendicularly to the longitudinal axis of the electrode 7 and their opposite outside ends F, D led to the face walls of the housing 10 are electrically shorted with the housing 10. The discharge tube 8 shown in FIG. 3 is situated below the plasma excitation zone and below the outlet hole edge in the central tube 9.

Figure 4:
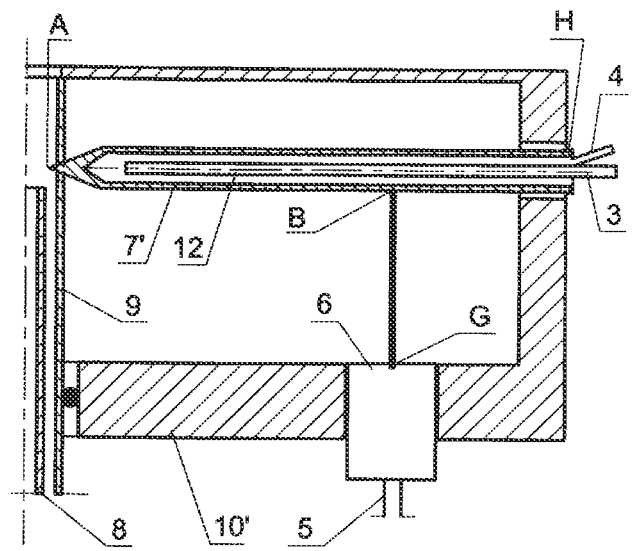

As shown in FIG. 4, another multi-electrode microwave plasma excitation source consists of at least three identical electrodes 7' arranged symmetrically in relation to the axis of the central tube 9 which supplies the analytical sample. The electrodes 7' are fixed in the electrically isolated metal housing 10' so that the tops A of the electrodes 7' are placed at the outlet of the central tube 9 and their ends are extended to the outside wall on the circumference of the housing 10'. In addition, the electrodes 7' are shorted on the circumference in the power supply point B with the microwave connections 6 embedded in the housing 10' perpendicularly or at a different angle to the longitudinal axis of each of the electrodes 7'. The connecting point G of the microwave connection 6 is situated at the inside face wall of the housing 10'. The microwave connections 6 are connected with the microwave power source via the power supply input 5. The cooling system consists of the system which supplies the cooling agent to and removes it from the electrodes 7'. Each of the electrodes 7' has a hollowed longitudinal flow chamber for the cooling agent with the embedded internal tube 12 connected with the inlet tube connector 3 situated outside the electrode and the outlet tube connector 4 is connected to the internal channel in the flow chamber arranged around the internal tube 12. The tube connectors 3, 4 are situated outside the metal housing 10'. The flow chamber at the end of the electrodes 7' is closed with the mounting H. The length of each of the electrodes 7', measured from its top A to its end at the outside wall on the circumference of the housing 10', is ¾ L, where L is the length of the microwave generated by the microwave power source, the distance from the power supply point B to the top A is ½ L, and the distance from the electrode 7' to the microwave connection 6 embedded in the housing 10' is ¼ L. The ends of the electrodes 7' are shorted with the housing 10', favourably through the metal mounting H. If a 2.45 GHz microwave power source is used, the microwave length L is approximately 12 cm and the length of the electrode 7' is approximately 9 cm. The central tube 9 can be installed inside the discharge tube 8 which supplies air, operating gas or curtain gas. Both tubes are made of a dielectric material, usually of ceramics or quartz. The internal tube 12 installed inside the electrode 7' can be made of metal or a dielectric material.

What is claimed is:

1. An electrode cooling system for a multi-electrode microwave plasma excitation source, comprising the electrode cooling agent supply and removal systems, while the excitation source consists of at least three identical electrodes arranged symmetrically in relation to the axis of a central tube which supplies an analytical sample and the electrodes are mounted in an electrically isolated metal housing so that the electrode tops are placed at the central tube outlet, and their ends are shorted in the power supply point with the microwave connections embedded in the housing on the extension of the electrode longitudinal axis and the connections are coupled with the microwave power source, particularly of 2.45 GHz frequency, whereas the length of each electrode measured from its top to the power supply point is ¼ L, where L is the length of the microwave generated by the microwave power source, characterized in that each electrode (7) has a hollowed longitudinal flow chamber for the cooling agent connected with metal side tubes (1, 2), the first and the second ones, which supply and remove the cooling agent, while the outside ends (D, F) of the side tubes (1, 2) are electrically shorted with the housing (10) and the length of each side tube (1, 2) inside the metal housing (10), measured from the connection with the electrode (7) to the outside wall of the housing (10), is ¼ L and moreover, the side tubes (1, 2) are isolated from the housing (10) over the entire length.

2. The cooling system, of claim 1, wherein the side tubes (1, 2) are connected outside the housing (10) with the tube connectors (3, 4), at the inlet and outlet.

3. An electrode cooling system for a multi-electrode microwave plasma excitation source, comprising the electrode cooling agent supply and removal systems, while the excitation source consists of at least three identical electrodes arranged symmetrically in relation to the axis of a central tube which supplies an analytical sample and the electrodes are mounted in an electrically isolated metal housing so that the electrode tops are placed at the central tube outlet, and their ends are extended to the outside wall on the housing circumference and additionally the electrodes are shorted on the circumference in the power supply point with the microwave connections embedded in the housing and the connections are coupled with the microwave power source, particularly of 2.45 GHz frequency, whereas the length of each electrode measured from its top to its end at the outside wall on the housing circumference is ¾ L, where L is the length of the microwave generated by the microwave power source, characterized in that each electrode (7') has a hollowed longitudinal flow chamber for the cooling agent with the embedded internal tube (12) connected with the inlet tube connector (3) placed outside the electrode and the outlet tube connector (4) is connected to the internal channel in the flow chamber arranged around the internal tube (12) and the tube connectors (3, 4) are located outside the metal housing (10'), whereas the end of each electrode (7') is shorted with the housing (10'), the distance from the power supply point (B) to the top (A) is ½ L and the distance from this point to the microwave connection (6) embedded in the housing (10') is ¼ L.

\* \* \* \* \*